(12) United States Patent
Fiocchi

(10) Patent No.: US 8,648,660 B2
(45) Date of Patent: Feb. 11, 2014

(54) AMPLIFIER WITH NON-LINEAR CURRENT MIRROR

(75) Inventor: Carlo Fiocchi, Belgioioso (IT)

(73) Assignee: AMS AG, Unterpremstaetten (AT)

( * ) Notice: Subject to any disclaimer, the term of this patent is extended or adjusted under 35 U.S.C. 154(b) by 72 days.

(21) Appl. No.: 13/343,521

(22) Filed: Jan. 4, 2012

(65) Prior Publication Data

US 2012/0169422 A1    Jul. 5, 2012

(30) Foreign Application Priority Data

Jan. 4, 2011  (EP) .................................... 11150119

(51) Int. Cl.
*H03F 3/45* (2006.01)
(52) U.S. Cl.
USPC .......................................... 330/257; 330/310
(58) Field of Classification Search
USPC .......................................... 330/252–261, 136
See application file for complete search history.

(56) References Cited

U.S. PATENT DOCUMENTS

| 7,084,704 | B2 * | 8/2006 | Sowlati ......................... 330/253 |
| 2005/0140437 | A1 | 6/2005 | Maclean et al. |
| 2006/0250190 | A1 | 11/2006 | Okada |

FOREIGN PATENT DOCUMENTS

WO    WO 98/33272    7/1998

OTHER PUBLICATIONS

R. Costello, et al., "A High-Performance Micropower Switched-Capacitor Filter", IEEE Journal of Solid-State Circuits, vol. SC-20, No. 6, pp. 1122-1132, Dec. 1985.
C. Fiocchi et al., "A Very Flexible BICMOS Low-Voltage High-Performance Source Follower", Circuits and Systems, 1999, ISCAS '99, Proceedings of the 1999 IEEE International Symposium on Jul. 1999, vol. 2, pp. 212-215, ISBN: 0-7803-5471-0.
R. Hogervorst et al., "A compact power-efficient 3V CMOS rail-to-rail input/output operational amplifier for VLSI cell libraries", IEEE, Journal of Solid-State Circuits, vol. 29, No. 12, pp. 1505-1513, 1994.

* cited by examiner

*Primary Examiner* — Hieu Nguyen
(74) *Attorney, Agent, or Firm* — McDermott Will & Emery LLP

(57) ABSTRACT

An amplifier with a non-linear current mirror comprises an amplification stage having an input terminal for an input signal as well as an output stage coupled to the amplification stage by a current mirror stage. The current mirror stage comprises at least one mirror transistor coupled to the amplification stage and at least one output transistor coupled to the output stage. The amplifier comprises two variable resistive elements, each of them connected in series to one of the mirror transistor and the output transistor. A tuning stage is adapted to tune the variable resistive elements in response to the input signal.

14 Claims, 7 Drawing Sheets

AMPLIFIER WITH NON-LINEAR CURRENT MIRROR

RELATED APPLICATIONS

This application claims the priority of European application no. 11150119.3 filed Jan. 4, 2011, the entire content of which is hereby incorporated by reference.

FIELD OF THE INVENTION

The present invention relates to an amplifier with a non-linear current mirror.

BACKGROUND OF THE INVENTION

Amplifiers are used in a variety of different applications. Depending on the requirement, there are different approaches to implement amplifiers in a circuit. Depending on the amplification behavior, amplifiers can be divided into several classes. For a so-called class AB amplifier, a requirement often to be considered is to provide an output current higher than a bias current while at the same time avoiding possible oscillations due to a large input signal. That problem occurs due to the fact that output currents quite larger than the respective bias current also increase the transconductance of the amplifier stage. To avoid oscillations generated by large input signals, it may be necessary to keep the transconductance of the amplifier stage small enough in any operating condition.

Although several solutions have been proposed in the art using class AB amplifiers or quasi-class AB amplifiers, there is still a need for an amplifier with improved characteristics.

SUMMARY OF THE INVENTION

For this purpose, one embodiment of the present invention provides an amplifier with a non-linear current mirror comprising an amplification stage with an input terminal for an input signal as well as an output stage coupled to the amplification stage by a current mirror. The current mirror comprises a variable gain control, wherein tuning the gain of the current mirror stage is achieved by a respective tuning element in response to an input signal applied to the amplification stage.

In an embodiment, the current mirror stage of the amplifier comprises at least one mirror transistor coupled to the amplification stage, at least one output transistor coupled to the output stage, and at least two variable resistive elements. One of the resistive elements is connected in series to the at least one mirror transistor and another one of the resistive elements is connected in series to the at least one output transistor.

The variable resistive elements provide a current mirror having variable gain, said gain depending on the amount of current crossing the current mirror. For this purpose, the tuning stage is adapted to tune the variable resistive elements in response to the input signal.

In another embodiment, a current mirror comprises a variable gain depending on the amount of a current crossing the current mirror. A mirror stage of that mirror is cascaded to a differential pair of an amplification stage, said amplification stage receiving the input signal. Due to the dependence of the amount of current crossing the current mirror, an increasing mirroring ratio after a current increase achieves several goals, including an improved linearity, a low current mirror gain where no input signal is supplied to the amplification stage as well as an improved slew rate during amplification.

In a further embodiment, the resistive elements comprise a field-effect transistor whose gate is coupled to the tuning stage. The field-effect transistor is an element with variable resistive characteristics.

In a further embodiment, the amplification stage comprises a differential amplifier with a first and a second branch. Each branch may be connected to one mirror transistor of the current mirror stage, which in turn is connected in series to a variable resistive element, e.g. a field-effect transistor.

In another aspect, the tuning stage comprises an input part to receive the input signal and an output part comprising at least a tuning diode coupled to the input stage. In response to the input signal, the tuning stage provides a tuning signal via the at least one tuning diode to the resistive elements in the current mirror, thereby changing its gain.

The tuning diode may comprise a transistor coupled with its gate to the resistive element and to the input part of the tuning stage.

In a further embodiment, the input part of the tuning stage may comprise a differential amplifier having similar characteristics as the amplification stage in the amplifier. For instance, amplifier transistors in both stages, in the amplification stage as well as in the input part of the tuning stage may be similar, equal or have a predetermined geometric ratio. As a result, the tuning signal may be dependent from the amplification ratio in the amplification stage.

Further, the amplification stage may receive a supply signal, that supply signal being in a predetermined ratio with respect to a supply signal provided to the tuning stage.

In a further embodiment, the amplifier comprises a bias supply circuit coupled to the tuning stage and adapted to provide a bias signal to the tuning diodes, thereby controlling the tuning signal to the resistive elements. The bias supply circuit may prevent an undesired condition wherein the resistive elements are completely switched off.

BRIEF DESCRIPTION OF THE DRAWINGS

The invention will now be explained in greater detail with respect to the accompanying drawings. Similar circuit elements may bear the same references.

DETAILED DESCRIPTION OF THE DRAWINGS

The difficulty in a class AB amplifier solution is keeping the bias current in the output device under control, for instance to avoid excessive spread in static power consumption.

A typical class AB amplifier may be critical if adapted in a feedback loop. If a large input signal is applied to the amplifier, the output current becomes large as well, sometimes causing output overshooting. When in a feedback loop, the consequent recovery may cause an opposite overshooting as well, as the class AB amplifier stage will now be driven in the opposite direction. As a result, continuous oscillation between the two extremes may occur even if the amplifier has an excellent AC phase or gain margin.

Figure 12:
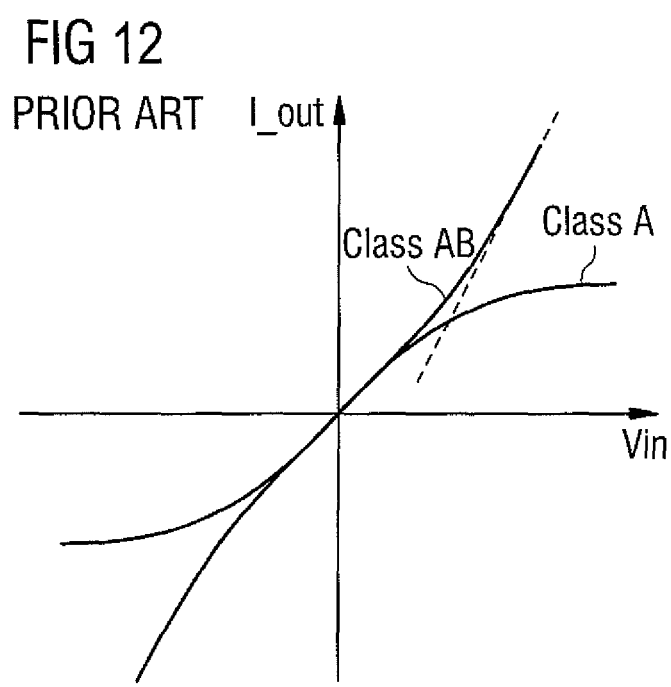
FIG. 12 shows an output current diagram versus an input voltage signal of a class AB amplifier and a class A amplifier.

This problem can be seen in FIG. 12, comparing the output current vs. the input signal for a class A and a class AB amplifier. While a class A amplifier only comprises a very narrow linear relationship between the input signal $V_{IN}$ and the output current $I_{OUT}$, the class AB approach provides a much larger region where current is sensitive to Vin input voltage variations. However, as indicated by the dotted line, the current output of a class AB amplifier is excessively sensitive to signal variations during large signal conditions.

While, on the other hand, a quasi-class AB solution approach can be considered almost unaffected by this problem, the major concern of such a solution is associated to the excessive large transconductance of the stage when a small input signal is applied if compared to the target current drive capability. At the same time, the linearity range in the relationship between the output current and the input signal may be even worse compared to a simple class A amplifier.

Figure 6:
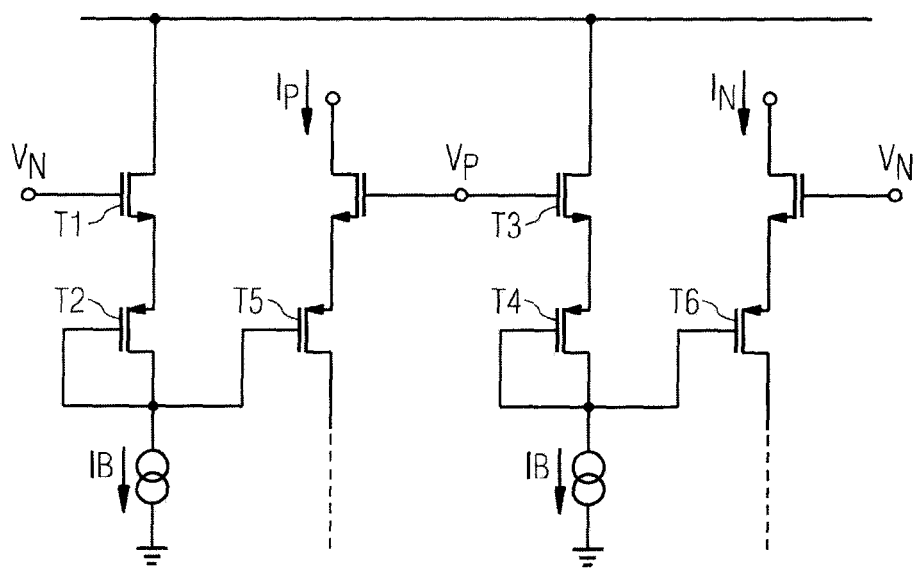
FIG. 6 shows a known single stage class AB solution.

A class AB amplifier is illustrated in FIG. 6. It embodies a classical single stage solution, where both the input signal sensing as well as the output current generation is implemented in the same series circuitry. Two field-effect transistors of complementary structure T1, T2 and T3, T4 (PNP-NPN) are connected in series to receive the respective differential input signal $V_N$, $V_P$. Each second transistor T2 and T4 is implemented as a diode to level shift the differential input and drive a respective output transistor T5, T6. The illustrated input structure provides careful control over the bias current of the whole stage and an almost unlimited output current $I_P$, $I_N$ to the respective output stage in case of large input voltage signal.

However, as already indicated, the circuitry according to FIG. 6 is prone to ringing and oscillation if used in a feedback loop for very high input signals. Furthermore, due to the series circuitry of a P and an N-type field-effect transistor, the input signal $V_N$, $V_P$ is somewhat limited.

Figure 7:
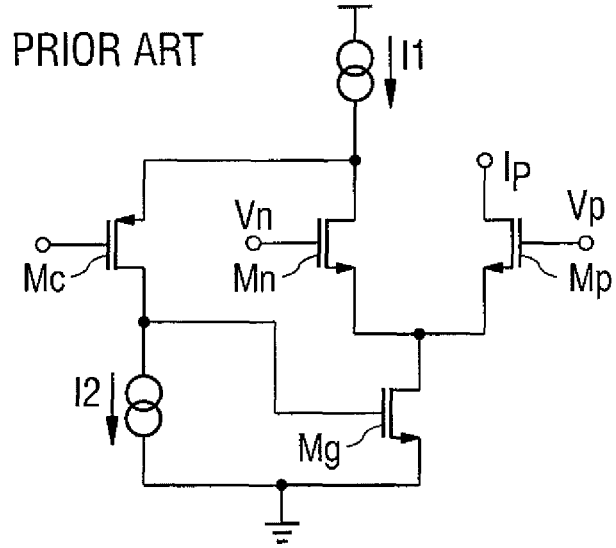
FIG. 7 illustrates an alternative to the already known solution in FIG. 6.

To overcome this limitation, FIG. 7 illustrates one stage of a class AB amplifier, being able to alleviate the input dynamic range limitations. The level shift given in the previous FIG. 6 by the two transistors connected to current source $I_B$ is replaced by a feedback loop in the amplifier stage according to FIG. 7. Transistor Mn, receiving input signal Vn is forced by the feedback loop of current source I2 and transistor Mg to drive a constant current given by I1-I2 regardless of the input signal Vn. The net input signal drops across the gate to source voltage for the second input transistor Mp such that that transistor is capable of providing a large output current Ip. Mc denotes a bias transistor of the amplifier.

Figure 8:
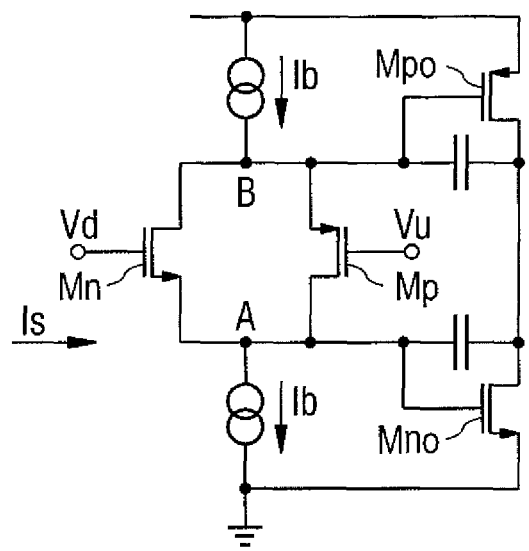
FIG. 8 illustrates a two-stage approach for a known class AB amplifier.

While the AB amplifier according to FIG. 7 provides a better input range, it still might suffer from the above reported large signal oscillation problem. Moreover, the loop comprising elements Mg, 12, Mc and Mn must be compensated. FIG. 8 shows an alternative embodiment for a class AB output stage.

The current from the input stage can be injected into either node A or node B, with the choice having no effect on circuit operation. Tight control across the output branch current is obtained by means of bias voltages Vu and Vd as well as the level shifting provided by transistor Mn and Mp. As the feedback loop comprising transistors Mn and Mp has positive gain just slightly less than unity, the impedance at the gates of the transistors Mno, Mpo becomes approximately infinite. This behavior ensures a large gain as well as a large signal swing after contribution of current Is.

For this reason, transistors Mno and Mpo can drive a very large current to the output load. However, due to the high impedance at these nodes, Miller compensating capacitors have to be provided implemented herein by the two capacitors connecting the gates of the respective transistors Mno, Mpo to both drain terminals. As a drawback, PSRR (Power Supply Rejection Ratio) at high frequency can be estimated to be around −6 dB for equally sized Miller capacitors.

Figure 9:
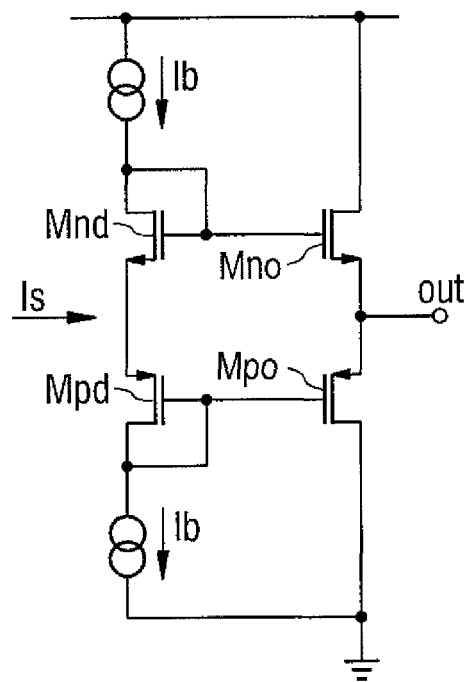
FIG. 9 shows a popular push-pull amplifier.

A further class AB amplifier is given in FIG. 9, implemented as a so-called push-pull amplifier. The amplifier comprises an input terminal between the two transistors Mnd, Mpd as well as an output terminal. This amplifier suffers from an evident swing limitation at high input signal levels.

Figure 10:
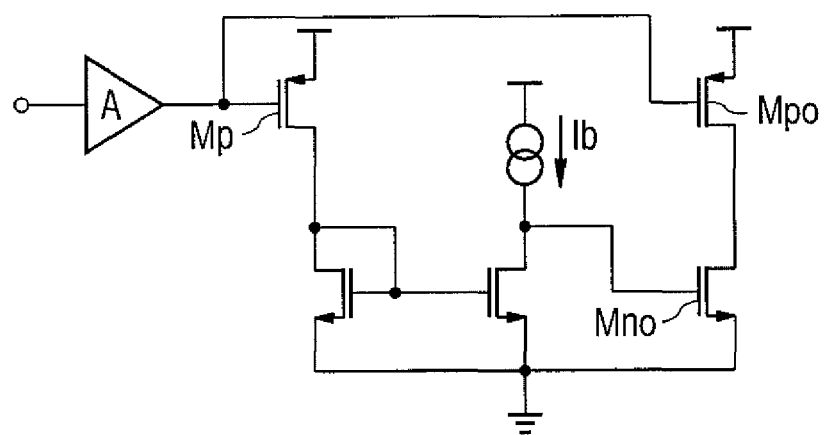
FIG. 10 illustrates an amplifier to implement a class AB operation.

The three-stage approach in FIG. 10 also refers to a class AB operation. The input stage A provides a high output impedance and a large swing to directly drive the gate of the output transistor Mpo. The gate of the transistor Mno is driven by an additional amplification stage comprising transistor Mp, a current mirror and a current generator Ib. This intermediate stage provides the necessary large signal swing for the gate of transistor Mno. Transistors Mpo and Mp are matched to ensure that the current in the output branch tracks current Ib in a static condition.

Figure 11:
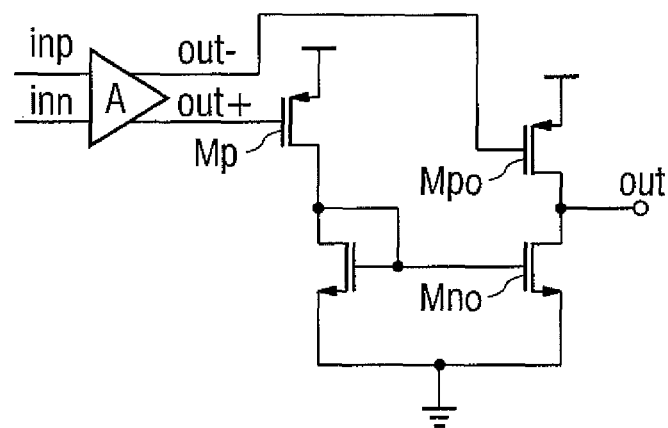
FIG. 11 shows another example of a class AB amplifier with two stages, whose output stage is differentially driven by differential amplifier A.

A further embodiment presented in FIG. 11 implements a differential class AB amplifier with two stages. It is similar to the embodiment of FIG. 10. However, this implementation requires a fully differential input stage, thereby increasing size, complexity and design efforts. Transistors Mp and Mpo are driven by complementary signals from stage A having both a large swing as well as gain.

Figure 5:
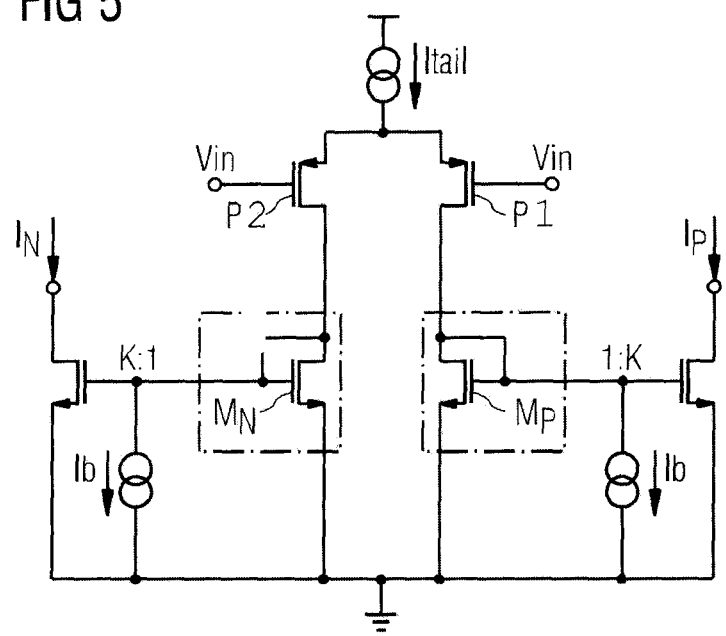
FIG. 5 illustrates a known embodiment of a quasi-class AB amplifier.

FIG. 5 finally illustrates an embodiment of a quasi-class AB amplifier. The amplifier comprises two current mirrors with a respective transistor pair whose gates are coupled with a mirroring ratio of 1:K. A node between each gate of the respective current mirror transistors is connected to a respective current source Ib coupled to ground. The current mirror transistors Mn and Mp act as a diode as their respective gates are coupled to output terminals of amplifier transistors P2, P1, respectively. The geometric ratio between the current mirror transistors Mn, Mp provides a fixed gain. The current generator Ib subtracts current from the diode of the mirror such that the current across the diode is given by Itail/2−Ib in steady state, wherein Itail is the supply current applied to the amplifier transistors P2 and P1. If the differential input signal Vin is a very large operating one of the transistors P1, P2 in saturation, this value may become Itail−Ib.

As a result, the ratio between the slew rate current and the bias current is equal to (Itail−Ib)/(Itail/2−Ib). It is clear that as soon as current Ib approaches Itail/2, this ratio may increase to be comparable with one coming from a full class AB amplifier. Although the implementation of a quasi-class AB amplifier is quite simple, it has also some drawbacks.

First of all, the device may fail in cases where the currents Ib from the current generator exceed the current through the diode given by Itail/2. Such behavior can happen during a mismatch or a poor PSRR in the biasing block. In such case, one of the current mirrors is not biased causing a failure in the device. Hence, some safety margins must be insured to keep the current Ib lower than Itail/2, thus limiting the achievable efficiency in the slew rate. In addition, the mirror is usually designed to have a gain much larger than unity to obtain an output current $I_N$, $I_P$ larger than the supply or tail current Itail. However, such approach will reduce the speed of the current mirror while at the same time increasing the total gain bandwidth (GBW) of the amplifier. To the slew rate, larger compensating caps have to be adapted, which may should be avoided or is unnecessary in some cases.

Finally, if the current from the differential pair drops below the current Ib, the gate/source voltage Vgs of the mirror is rapidly discharged to zero. When the input signal now reverses polarity, a huge delay may be the result due to the threshold voltage of the diode, thereby increasing non-linear effects.

To overcome these limitations, the present invention proposes an amplifier comprising a current mirror having variable gain depending on the amount of a current crossing a current mirror. As the current mirror is cascaded to a differential pair in an amplification stage, a larger mirroring ratio after a current increase achieves several goals. While the sensitivity of the differential pair in the amplification stage is reduced at large signals, the increase of the current mirror gain at large signals tends to face the amplification sensitivity reduction. As a result, improved linearity is achieved even at high input signals.

However, when no signal is applied, the current mirror gain can be kept quite low. In this way, no large GBW is expected to allow the use of small compensating caps.

Figure 1:
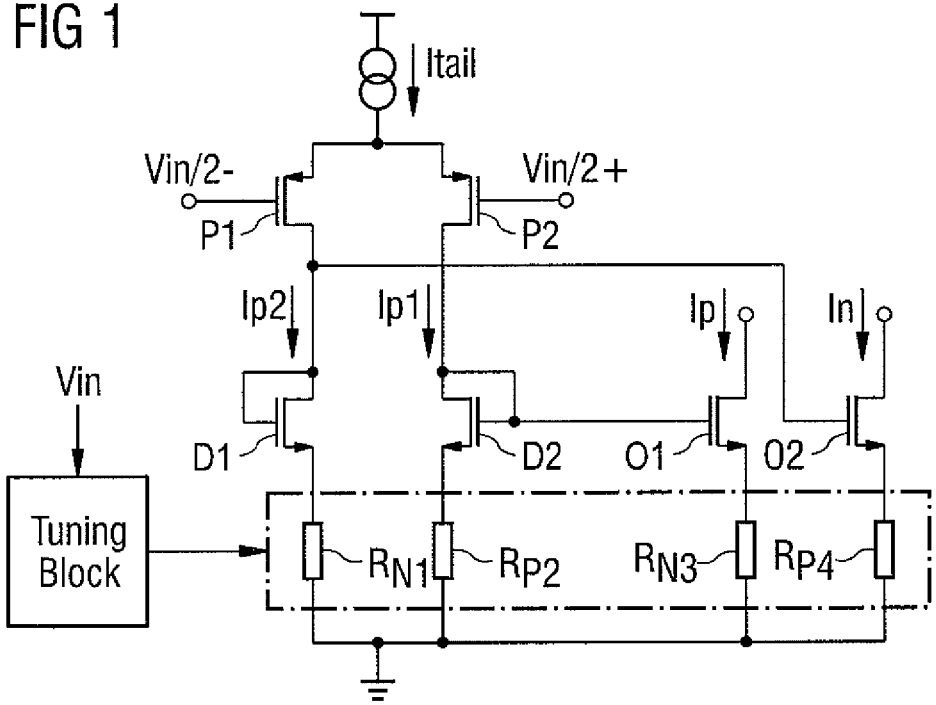
FIG. 1 illustrates an amplifier with a non-linear current mirror, according to a first embodiment of the invention.

FIG. 1 illustrates an embodiment of the invention. An amplification stage comprises two input transistors P1, P2 at which an input signal Vin for differential amplification can be applied to. Transistors P1 and P2 are part of a first and a second branch, respectively, of the amplification stage, being connected with one terminal to the current supply source providing supply current Itail. The other terminals of the transistors P1, P2 and the respective branches are coupled to current mirror transistors D1 and D2, respectively. These current mirror transistors act like a diode as their respective gate terminals are connected to a node between the respective current mirror transistors and the input transistors P1, P2 from the amplification stage.

In addition, the gates of the current mirror transistors are coupled to the respective gates of mirrored transistors in an output branch of the amplifier. Particularly, the gate of current mirror transistor D1 is connected to the gate of transistor O2 providing the output current In. Accordingly, the gate of transistor D2 is coupled to the node between transistor P2 and transistor D2 and to the gate of output transistor O1.

In order to provide a current mirror with a variable gain, the second terminals of the respective mirror transistor D1, D2 are connected to variable resistive elements $R_{N1}$, $R_{P2}$, respectively. Likewise, the second terminals of output transistors O1, O2 are coupled to variable resistive elements $R_{N3}$ and $R_{P4}$. The variable resistive elements are tuned by a tuning block (as explained in detail with respect to FIGS. 2 and 3) in a response to the input signal, and in this particular embodiment in response to the current fractions Ip2, Ip1 derived by the current through transistors P1, P2 in the amplification stage.

The variable resistive elements $R_{N1}$ and $R_{N3}$ coupled to mirror transistor D1 and output transistor O1 are proportional to each other and are tuned from the same signal from the tuning block. Likewise, the resistive elements $R_{P1}$ and $R_{P3}$ coupled to mirror transistor D2 and output transistor O2 share the same signal from the tuning block being proportional to each other.

In this embodiment, the current mirror with a variable gain is implemented by tunable resistors in series at the source of the current mirror devices, given by transistors D1, D2, O1 and O2. The differential amplifier transistor pair P1, P2 connected to the mirror transistors D1, D2 provide a current fraction Ip1, Ip2 of the tail current Itail to the respective current mirror. Depending on the ratio between Ip1, Ip2, the tuning block varies the resistance of the resistant elements to provide a non-linear gain in the current mirror itself. Particularly, if the resistances $R_N$ and $R_P$ are arranged to make D1, D2, O1, O2 transconductance contributions negligible, the output current In is generated with a factor of $R_N/R_P$ while output current Ip is generated with a factor of $R_P/R_N$.

If a signal Vin is applied to the amplifier transistors P1, P2, the respective currents Ip1, Ip2 are varied, thereby tuning the resistive elements to provide a larger gain in the mirror. In case where the currents Ip1, Ip2 are equal, the mirror gain for generating the output currents In, Ip will be equal to close to unity. In this condition, the transconductance value gm of the amplifier is determined only by the input differential pair and not boosted like in the embodiment of FIG. 5.

Figure 2:
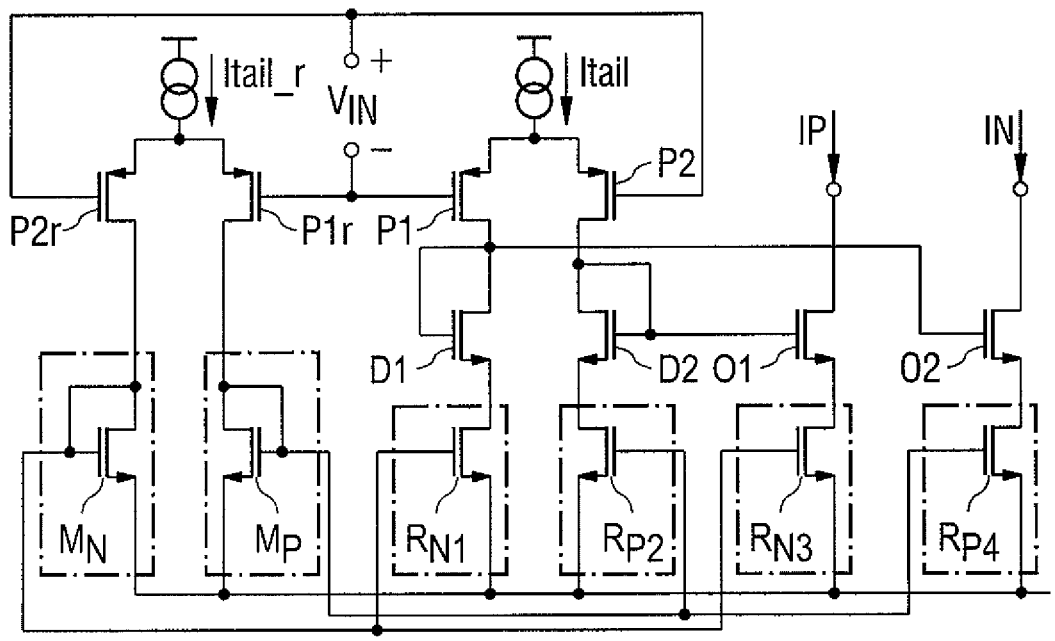
FIG. 2 illustrates an amplifier according to a second embodiment of the invention.

FIG. 2 shows an implementation of the amplifier according to the invention including an embodiment of the tuning circuit. In this embodiment, the tuning circuit is implemented similarly to the amplification stage with two amplifier input transistors P1r and P2r, respectively. The gate of transistor P1r is coupled to the gate of transistor P1 to receive one branch of the differential input signal. Likewise, the gate of transistor P2r is connected to the gate of transistor P2 and to the input terminal for receiving the other branch of the input signal Vin.

The amplifier transistors in the tuning section are supplied by a supply current source providing a supply current Itail_r. The outputs of the transistors P1r, P2r are coupled to diode-like elements implemented by transistors Mp and Mn, respectively. The gate of each transistor is connected to a node arranged between the respective diode and the output of the amplifier transistor P1r, P2r. Further, the gate also provides the output signal to the variable resistive elements. Particularly, the gate of transistor Mp is connected to the variable resistive elements for changing resistance value $R_P$ and more particularly to gates of transistors $R_{P2}$ and $R_{P4}$. The gate of transistor $M_N$ is connected to gates of transistors $R_{N1}$ and $R_{N3}$.

Depending on the input signal Vin and the tail current Itail_r of the tuning block, the diodes implemented by field-effect transistors Mp and Mn provide a control signal to the respective variable resistive elements in the current mirror. Implementing a predetermined size ratio between the amplifier transistors in the tuning stage and the amplifier transistors in the amplification stage as well as a current ratio between the supply currents Itail and Itail_r, one can choose proper selection signal to drive the variable resistive elements. In particular, it is possible to reduce the overall power consumption by choosing the proper geometry.

Figure 3:
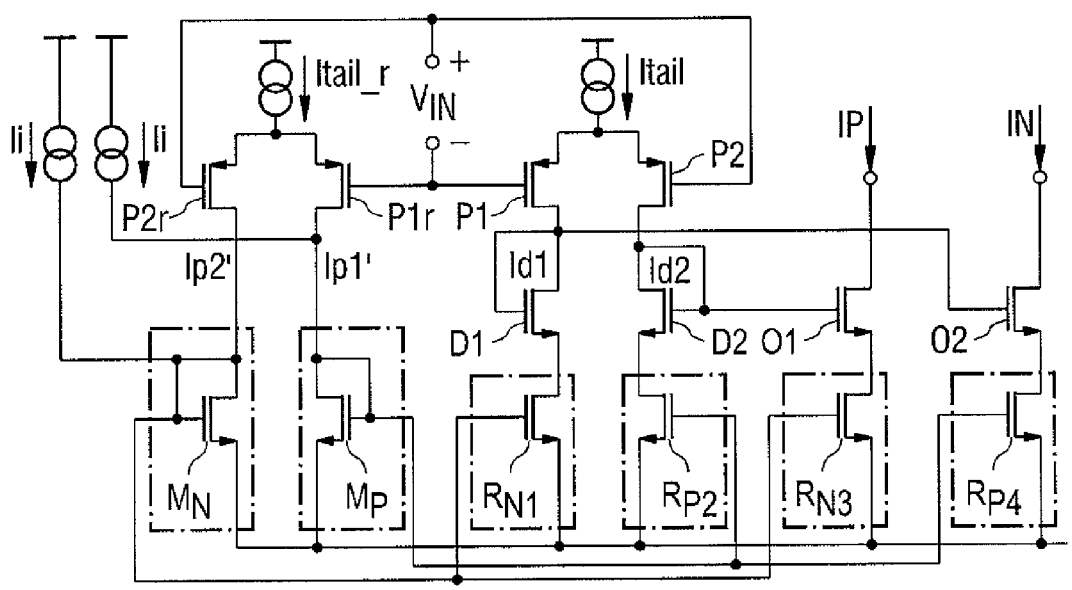
FIG. 3 shows another embodiment of an amplifier according to the invention.

FIG. 3 illustrates a further embodiment of the invention.

As illustrated before, the transistors P1, P2 implementing a differential input pair of an amplification stage split the supply current Itail into two diodes D1, D2, respectively. These diodes are implemented by field-effect transistors whose gates are coupled to a respective node between the amplifier input transistors P1, P2 and their respective drain terminals. Diodes D1, D2 are part of a current mirror to generate the output currents Ip and In. For this purpose, the amplifier comprises an output stage including two branches, each of them comprising a transistor O1, O2. Transistor O2 is coupled with its gate to the node between diode D1 and transistor P1 while the gate of transistor O1 is connected to the node between diode D2 and transistor P2. Both transistors are forming the output transistors of the current mirror. By choosing a proper size or geometry between the field-effect transistors acting as diodes and the output transistors of the current mirror, one can provide a differential output.

The variable resistive elements connected in series to the current mirror are also implemented by field-effect transistors Rn1 to Rp4. These transistors are connected to the respective sources of the field-effect transistors building the current mirror. In case the transconductance of transistors D1 and D2 is sufficiently large, the gain of the current mirror to generate output current In is given by the ratio of the resistance values $R_{N1}/R_{P4}$. Accordingly, the output current $I_P$ is dependent on the ratio $R_{P2}/R_{N3}$. The gain of the current mirror to generate output current In is given by the ratio of the resistance values $R_{N1}/R_{P1}$. Accordingly, the output current $I_P$ is dependent on the ratio $R_{P2}/R_{N2}$.

The resistance values of the respective transistors $R_{N1}$, $R_{N2}$, $R_{P1}$, and $R_{P2}$ depend on the gate voltage applied to the associated transistors generated by the tuning stage. The tuning stage comprises input transistors P1r, P2r connected to the input signal terminal for receiving the input signal. The differential input pair P1r, P2r is matched to the differential pair of transistors P1, P2 to share the same gate/source voltage and input signal. The supply current Itail_r through the tuning block is matched to the current Itail supplied to the amplifier. Any scaling among the current values automatically implies the same scaling between the differential pairs in the amplification stage and the tuning block.

In this way, the diodes $M_N$ and $M_P$ receive a current which comprises the same ratio as the currents crossing the diode D1, D2 in the current mirror of the amplifier as well as through the associated resistors $R_{N1}$, $R_{P2}$. The transistors $M_N$, $M_P$ provide the gate/source voltage applied at the gates of the resistive devices connected in series to the current mirror.

When no signal is supplied, the same current crosses the diodes D1, D2 in the current mirror of the amplifier as well as the diodes $M_N$, $M_P$ in the tuning block. Accordingly, no differential current flow is provided at the output stage of the amplifier. Under the assumption that the mirrors are built with equally sized transistors, the total transconductance of the amplifier is equal to the differential pair of transistors P1, P2. In case a positive input signal is supplied, the current Id1 through diode D1 increases while current Id2 through diode D2 decreases. At the same time, in the tuning block current Ip1' increases as well, while current Ip2' decreases. As a result, the resistive elements $R_{P4}$ and $R_{P2}$ receive an increasing signal, thereby decreasing its resistance. Likewise, the decreasing flow through diode $M_N$ results in an increase of the resistance of elements $R_{N1}$ and $R_{N3}$. As a consequence, the current across D1 is mirrored to a larger amount if compared to the equilibrium condition where no signal is supplied. At the same time, a current across D2 is mirrored with a lower factor to the output stage. Hence, the current difference from the input pair Id1-Id2 is increased after crossing the mirror. Thus, a larger output current is obtained.

A further increase in the input signal increases both the differences between the gate/source voltage Vgs of diodes $M_N$ and $M_P$, resulting in the consequent variation of the ratios $R_{P2}/R_{N3}$ for output current $I_P$ and $R_{N1}/R_{P4}$ for current $I_N$. The differential output current increases for two reasons: a higher differential current from the input pair as well as the synergic gain variation in the current mirror.

When the system is fully unbalanced, the differential output current will be given by the current Itail*R_max/R_min, wherein R_max and R_min correspond to the maximum and minimum resistance values by the resistive elements $R_{N1}$, $R_{N3}$, $R_{P2}$, $R_{P4}$. If this variation is large, the output differential current may be much large than the tail current even if the current mirror has a unity gain when no signal is supplied.

Such behavior is remarkably different from the amplifier illustrated in FIG. 5, where the mirror must have a gain larger to unity to insure that the output differential current could be larger than the tail current. This allows a smaller and faster current mirror.

Theoretically, the resistance values of transistors $R_{N1}$, $R_{N3}$ or $R_{P2}$, $R_{P4}$ may become infinite when no current flows in the associated reference diodes $M_N$ and $M_P$ in the tuning block. Such behavior would result in a high impedance of the respective drains to the extent that extremely high values of output current limited only by the signal swing and the transistor size can be achieved. This feature corresponds to a pure class AB amplifier.

In order to obtain a quasi-class AB amplifier, the output maximum current must be kept smaller and proportional to the supply or tail current Itail. For this purpose, the embodiment according to FIG. 3 comprises two additional current generators Ii connected to the nodes between diodes $M_P$, $M_N$ and differential pair transistors P1r, P2r. The current generators Ii are adapted to directly inject a small current into the tuning diodes and as such provide a signal also to the gates of the transistors implementing the resistive elements. In addition, the transistors which implement the resistive element may be operated in a triode condition. By operating in such condition, the drain of the transistors will be at low impedance.

The geometric size of the transistors acting as resistive elements must be chosen to be at least Itail/Ii times larger than the tuning diode $M_N$, $M_P$. Even if the supply current Itail is totally injected into the drains of the transistors $R_{N1}$, $R_{P2}$, the triode condition would be maintained.

Once ensuring the triode condition at maximum current in the output, two relationships in the transistors are of specific interest. First, the drain to source resistance $R_{DS}$ of the resistive elements, being biased in triode condition, is given by $$R_{DS}=1/[k*(V_{GS}-V_{TH})].$$

The term $V_{GS}-V_{TH}$ comes from the tuning diodes and it can be written as $V_{GS}-V_{TH}=2Id/gm$ once it operates above the threshold condition $V_{TH}$, being gm and Id its transconductance and drain current respectively.

In the assumption that the transconductance of the transistors is always much larger than $R_{DS}$ values, the gain of the current mirror is expressed as a resistor ratio. In this way, after rearranging the two expressions for $V_{GS}-V_{TH}$ we can calculate the maximum gain for the current mirror as $$\text{Maximum gain} = \sqrt{\frac{Itail}{Ii}}$$

It follows that the maximum output differential current will be equal to $$Itail * \sqrt{\frac{Itail}{Ii}}$$

As this factor depends only on the current ratio, it can be carefully controlled. Due to the dependence of a square root, the output current is also somewhat tolerant to mismatching.

Figure 4:
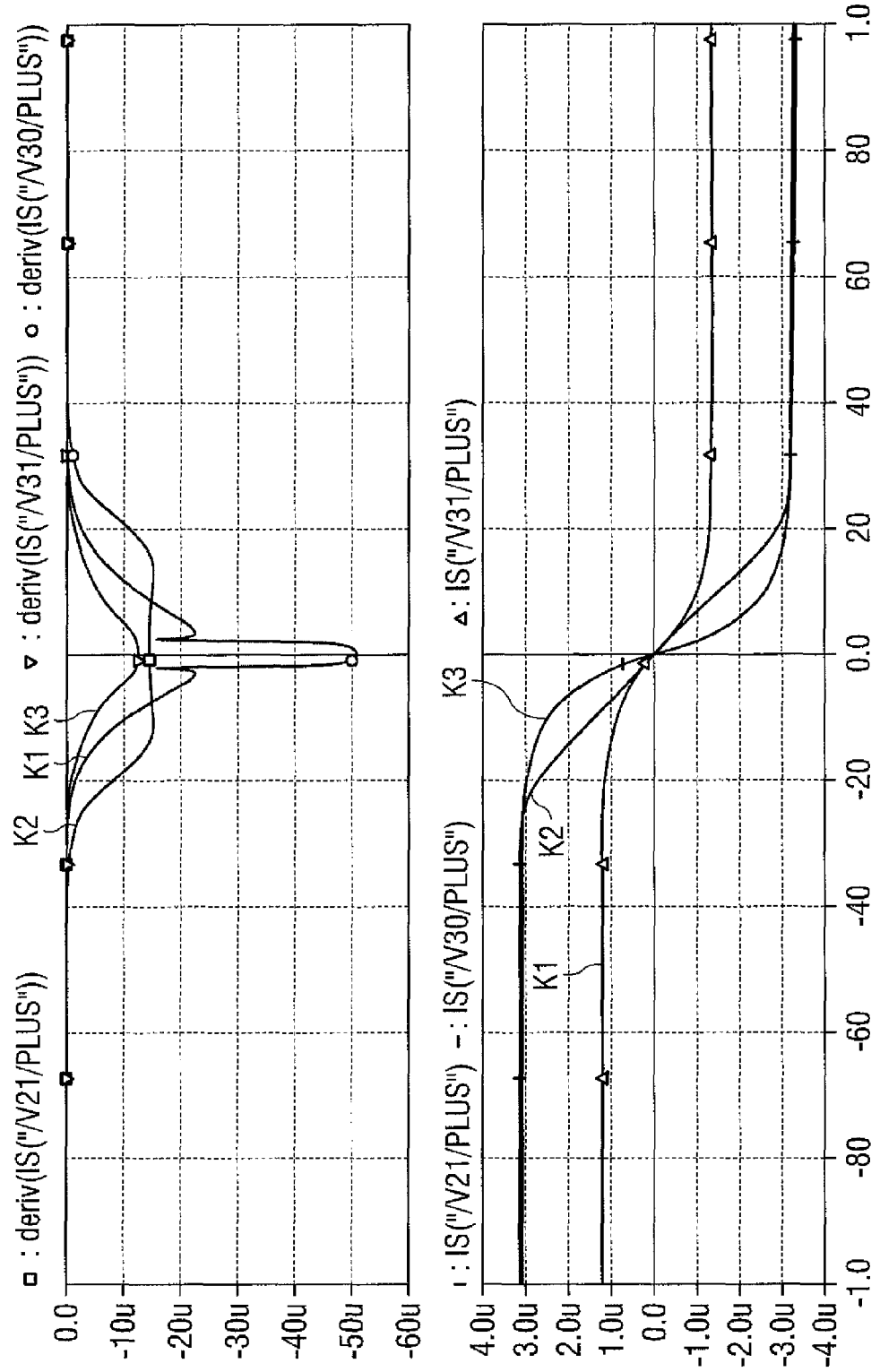
FIG. 4 shows a diagram of the transconductance and the output current against the input signal of the amplifier according to an embodiment of the invention as well as an amplifier known in the prior art.

FIG. 4 illustrates the performance (derived by the output current) in dependence on the input signal $V_{IN}$ for a classic differential stage whose current directly enters the output node, the quasi-class AB amplifier as illustrated in FIG. 5 as well as the amplifier of FIG. 3.

The lower part of the diagram illustrates the output current A over the input signal $V_{IN}$. Curve K1 corresponding to the classic differential stage comprises only a very small linear region around input signal $V_{IN}$=0. In addition the maximum output differential current is limited to Itail, supply current of the differential amplifier. The quasi class-AB approach given in curve K3 comprises a stronger maximum value but shares a similarly poor linearity range for the output current. In addition the net transconductance of the stage, presented in the upper region of the diagram for curve K3 gets very large. An excessive transconductance is usually associated to poor stability problems, as already pointed out regarding quasi class-AB structures.

On the contrary, curve K2 corresponding to the invention, ensures a much larger linear range for the output current while ensuring the same maximum value of the quasi class-AB approach. This means that, as reported in curve K2 in the upper region of the diagram, the transconductance of the invention is almost constant over a wide input voltage range and, mostly, always kept under very reasonable limits to avoid stability problems.

There is an easy explanation about this achievement: while the transconductance of the input stage decreases under larger input signal, the corresponding increase of the gain in the current mirror tends to keep the total resulting transconductance unaltered. Depending on the geometry ratio between the variable resistor elements and the matched diodes in the tuning circuitry, it is possible to find values such that the differential transconductance of the total structure is kept equal and not superior to the condition when no signal is applied over a very large range of values.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. An amplifier with a non-linear current mirror, comprising:
    an amplification stage having an input terminal for an input signal;
    an output stage coupled to the amplification stage by a current mirror stage, wherein the current mirror stage comprises:
        at least one mirror transistor coupled to the amplifier stage;
        at least one output transistors coupled to the output stage, and
        at least two variable resistive elements, wherein each of the at least two variable resistive elements comprises a field-effect transistor, wherein a controlled section of the field-effect transistor of one of the resistive elements is connected in series between the at least one mirror transistor and a reference potential terminal, and wherein a controlled section of the field-effect transistor of another one of the resistive elements is connected in series between the at least one output transistor and the reference potential terminal; and
    a tuning stage being adapted to tune the variable resistive elements in response to the input signal and being commonly connected to gate terminals of the field-effect transistors of the resistive elements.

2. The amplifier of claim 1, wherein the amplification stage is a differential amplifier with a first and a second branch, each branch connected to one mirror transistor of the current mirror stage.

3. The amplifier of claim 2, wherein a characteristic of at least one of the resistive elements coupled to one of the branches of the differential amplifier is similar to a characteristic of another one of the resistive elements coupled to the respective other branch in the output stage.

4. The amplifier of claim 1, wherein the tuning stage comprises an input part to receive the input signal and an output part comprising at least one tuning element that is coupled to the input part.

5. The amplifier of claim 4, wherein a node between the input part and the tuning element is coupled to the resistive elements.

6. The amplifier of claim 4, wherein voltage across the tuning element is applied as tuning signal to the resistive elements.

7. The amplifier of claim 4, wherein the tuning element is a diode.

8. The amplifier of claim 4, wherein the tuning element comprises a transistor, coupled with its gate to the resistive elements and to the input part.

9. The amplifier of claim 4, wherein the input stage is a differential amplifier having a first and a second branch, wherein each branch comprises a characteristic being in a predetermined relationship with the amplification stage.

10. The amplifier of claim 1, wherein the amplification stage is a adapted to receive a supply signal, said supply signal being in a predetermined ratio with respect to a supply signal provided to the tuning stage.

11. The amplifier of claim 1, further comprising a bias supply source, coupled to the tuning stage and adapted to provide a bias signal to the resistive elements.

12. The amplifier of claim 10, wherein the bias supply source is coupled to a node in the tuning stage, said node connected between the input part and the output part of the tuning stage.

13. The amplifier of claim 4, wherein the at least one tuning element is formed by a diode or by a field effect transistor connected with its gate to the input part, and wherein a voltage across the tuning element is applied to the gate terminals of the field-effect transistors of the resistive elements.

14. The amplifier of claim 13, wherein the tuning element is connected in series between the input part and the reference potential terminal.

* * * * *